(12) United States Patent
Yanagihara

(10) Patent No.: US 9,414,533 B2
(45) Date of Patent: Aug. 9, 2016

(54) WIRE BRANCH STRUCTURE
(71) Applicant: YAZAKI CORPORATION, Minato-ku, Tokyo (JP)
(72) Inventor: Yusuke Yanagihara, Shizuoka (JP)
(73) Assignee: YAZAKI CORPORATION, Tokyo (JP)
( * ) Notice: Subject to any disclaimer, the term of this patent is extended or adjusted under 35 U.S.C. 154(b) by 0 days.
(21) Appl. No.: 14/763,843
(22) PCT Filed: Jan. 20, 2014
(86) PCT No.: PCT/JP2014/050910
§ 371 (c)(1),
(2) Date: Jul. 28, 2015
(87) PCT Pub. No.: WO2014/119404
PCT Pub. Date: Aug. 7, 2014
(65) Prior Publication Data
US 2015/0366106 A1    Dec. 17, 2015
(30) Foreign Application Priority Data
Jan. 30, 2013    (JP) ................. 2013-015152
(51) Int. Cl.
| H01B 11/06 | (2006.01) |
| H01B 7/00 | (2006.01) |
| H01R 4/00 | (2006.01) |
| H01B 9/02 | (2006.01) |
| H05K 9/00 | (2006.01) |
| H02G 3/04 | (2006.01) |

(Continued)
(52) U.S. Cl.
CPC ............... *H05K 9/00* (2013.01); *H01B 7/0045* (2013.01); *H01R 9/032* (2013.01); *H02G 3/0487* (2013.01); *H01R 31/06* (2013.01)

(58) Field of Classification Search
CPC .............................. H05K 9/00; H01B 7/0045
USPC .............................. 174/36, 72 A, 72 R, 102 R
See application file for complete search history.

(56) References Cited

U.S. PATENT DOCUMENTS

| 5,126,507 A | 6/1992 | Kirma |
| 5,322,972 A | 6/1994 | Fitch et al. |

(Continued)

FOREIGN PATENT DOCUMENTS

| EP | 0535108 B1 | 3/1995 |
| EP | 0535070 B1 | 9/1995 |

(Continued)

OTHER PUBLICATIONS

Chinese Office Action issued on Apr. 21, 2016 in the counterpart Chinese patent application.

*Primary Examiner* — Sherman Ng
(74) *Attorney, Agent, or Firm* — Mots Law, PLLC

(57) ABSTRACT

A wire branch structure (1) includes a plurality of wires (3) and a shield member (5) which covers the circumference of the wires (3). One end side of each of the wires (3) is inserted in a main line side shell (7). The other end side of each of the wires (3) is branched from the main line side shell (7) and is inserted into branch line side shells (9, 11) respectively. An isolation part (15) is provided in the shield member (5), which isolates the wires (3) adjacent to a branch part (13) in which the other end side of each of the wires (3) is inserted in the branch line side shells (9, 11) respectively and branched.

11 Claims, 3 Drawing Sheets

(51) Int. Cl.
  *H01R 9/03*   (2006.01)
  *H01R 31/06*  (2006.01)

(56) References Cited

U.S. PATENT DOCUMENTS

| | | | | |
|---|---|---|---|---|
| 5,347,089 A | * | 9/1994 | Barrat | B29C 61/0641 |
| | | | | 156/49 |
| 6,160,216 A | * | 12/2000 | McMahon | H01B 7/0045 |
| | | | | 174/102 R |
| 2008/0296037 A1 | * | 12/2008 | Burland | H02G 3/0487 |
| | | | | 174/36 |

FOREIGN PATENT DOCUMENTS

| | | |
|---|---|---|
| JP | H05-508960 A | 12/1993 |
| JP | H05-508961 A | 12/1993 |
| JP | H11-008922 A | 1/1999 |
| JP | 2001-357737 A | 12/2001 |
| JP | 2006-310065 A | 11/2006 |
| JP | 2012-084275 A | 4/2012 |
| JP | 2013-222876 A | 10/2013 |
| WO | 92/00621 A1 | 1/1992 |
| WO | 92/00622 A1 | 1/1992 |

* cited by examiner

WIRE BRANCH STRUCTURE

TECHNICAL FIELD

The present invention relates to a wire branch structure.

BACKGROUND

As a conventional wire branch structure, one including a plurality of wires and a shield member that covers a circumference of the wires is known, in which one end sides of the wires are inserted in an inlet side cylinder body, and the other end sides of the wires are branched from the inlet side cylinder body and inserted into two outlet side cylinder bodies (refer to PTL 1).

This conventional wire branch structure is applied to connections between inverters and motor generators for example, and one end sides of the wires inserted in the inlet side cylinder body are connected to the inverters and the other ends of the wires inserted in the outlet side cylinder bodies are connected to two motor generators respectively.

By covering the circumference of the wires arranged as such with a shield member, penetration or leakage of noise or the like can be prevented.

CITATION LIST

Patent Literature

PTL 1: JP 2012-084275 A

SUMMARY

However, in the conventional wire branch structure, since the wires are covered by the same shield member in a lump, there was a possibility that an electromagnetic interference may occur to adjacent wires at a branch part of the wires which are inserted into the separate outlet side cylinder bodies and branched.

Therefore, an object of the present invention is to provide a wire branch structure which can prevent an electromagnetic interference of wires at a branch part of a plurality of wires.

A wire branch structure according toced to an aspect of the present invention includes a plurality of wires and a shield member that covers a circumference of the wires. One end side of each of the wires is inserted in a main line side shell. The other end side of each of the wires is respectively inserted in two or more branch line side shells that are branched from the one member side. The shield member is provided with one or more isolation parts that isolate the wires which are adjacent to a branch part in which the other end side of each of the wires is respectively inserted in the branch line side shells and branched.

By making the shield member provided with one or more isolation parts that isolate the wires which are adjacent to a branch part in which the other end side of each of the wires is respectively inserted in the branch line side shells and branched, an electromagnetic interference of the adjacent wires at the branch part of the wires can be prevented.

Each of the isolation parts is preferably formed by joining opposing parts of an inner circumference surface of the shield member.

By forming each of the isolation parts by joining opposing parts of an inner circumference surface of the shield member, the isolation parts can be provided without increasing the number of component parts.

According to the aspect of the present invention, an effect of being able to provide a wire branch structure which can prevent an electromagnetic interference of the wires at a branch part of a plurality of wires can be obtained.

DESCRIPTION OF EMBODIMENTS

Figure 1:
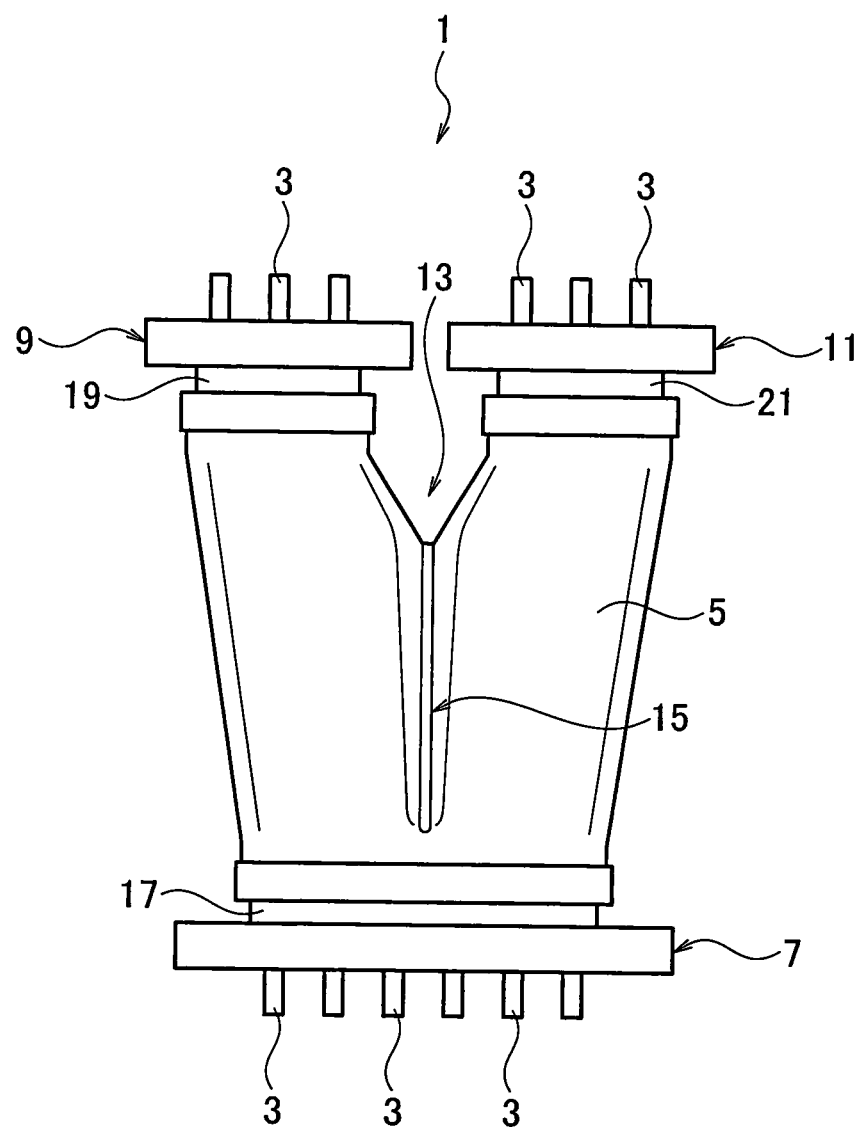
FIG. 1 is a top view of a wire branch structure according to an embodiment.

By referring to FIGS. 1 to 3, a wire branch structure according to an embodiment of the present invention will be explained.

A wire branch structure 1 according to the embodiment includes a plurality of wires 3 and a shield member 5 that covers the circumference of the wires 3. One end side (main line side) of each of the wires 3 is inserted into a main line side ring 7. The other end side (branch line side) of each of the wires 3 is respectively inserted into two branch line side shells 9, 11 which are branched from the main line side shell 7.

The shield member 5 includes an isolation part 15 which mutually isolates wires 3 which are adjacent to a branch part 13 in which the other end side of each of the wires 3 is respectively inserted into the branch line side shells 9, 11 and branched.

The isolation part 15 is formed by joining opposing parts of an inner circumference surface of the shield member 5.

Figure 2:
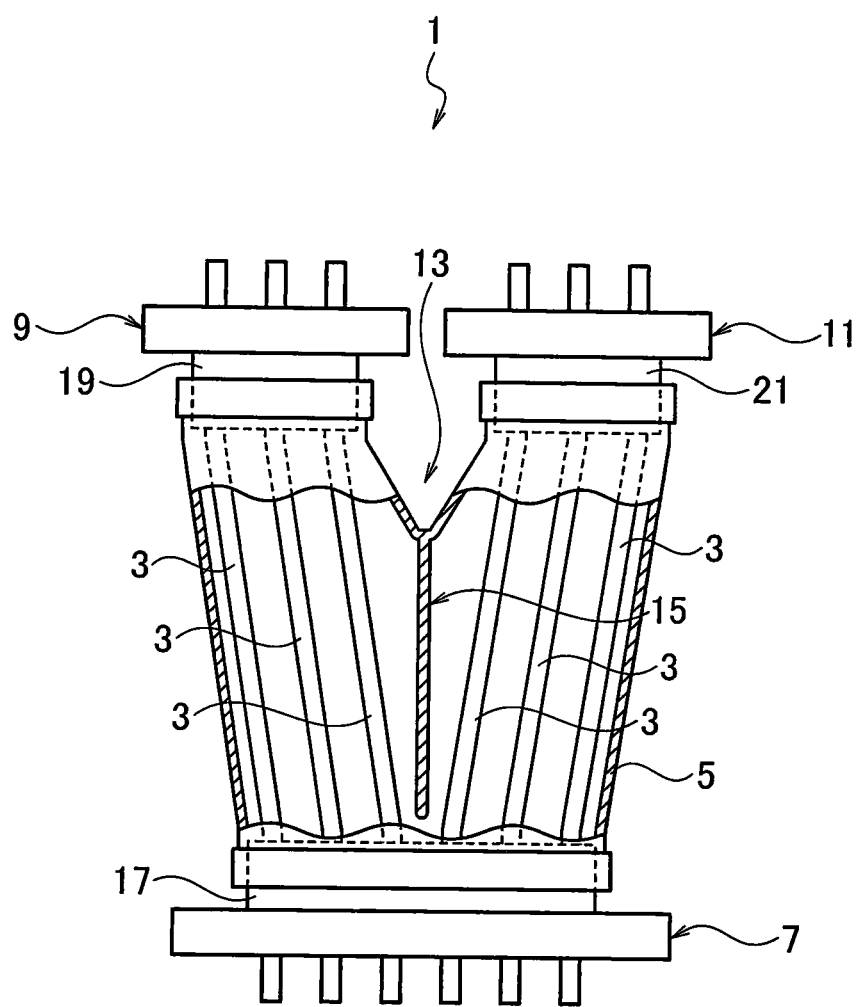
FIG. 2 is a partially sectional view of the wire branch structure according to the embodiment.
Figure 3:
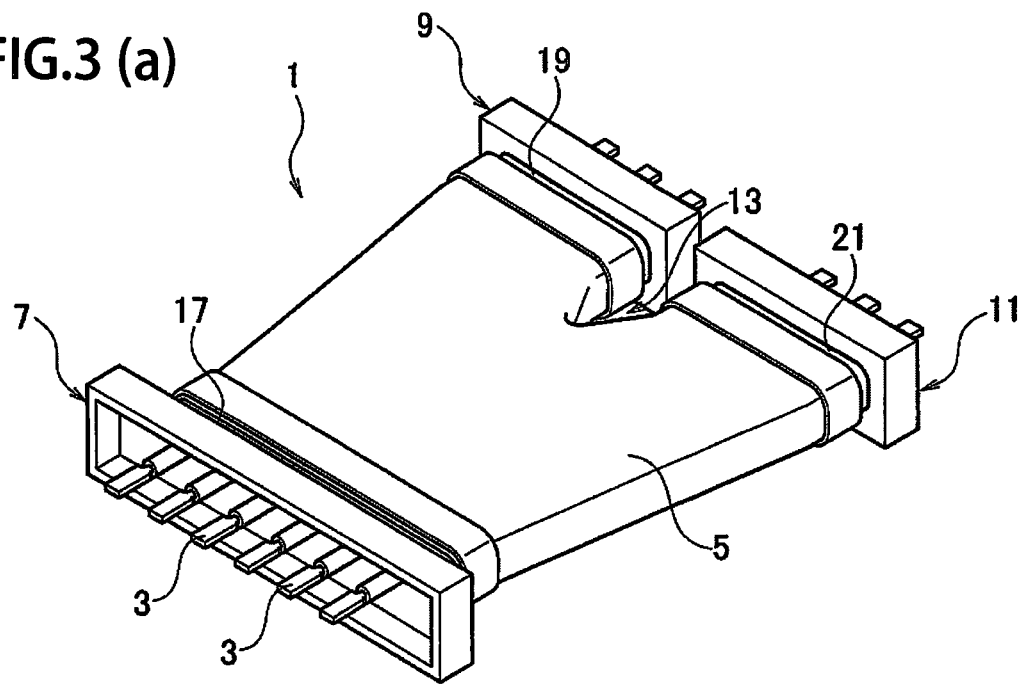
FIG. 3(a) is a perspective view in which a shield member of the wire branch structure according to the embodiment is assembled.
FIG. 3(b) is a perspective view in which an isolation part is provided to the shield member of the wire branch structure according to the embodiment.
Figure 3B:
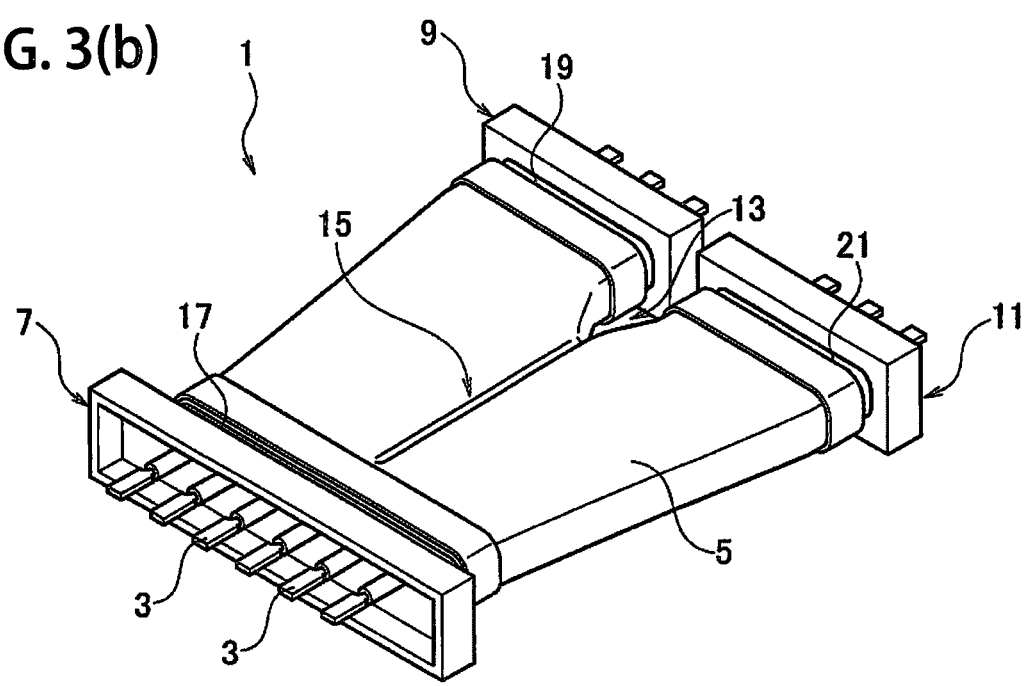

As illustrated in FIGS. 1 to 3, the plurality of (six here) wires 3 are arranged in parallel, and an insulation coating is peeled from both ends of each wire and the conductor part is made as terminals. In addition, the ends of the wires 3 may not be made as terminals, but terminals may be connected to the conductor parts by crimping or the like instead.

In the embodiment, at one end side of each of the wires 3, all of the wires 3 are inserted into the shell 7, and the other end sides of the wires 3 are branched at the branch part 13 such that three wires form one set, and each set (two sets here) is inserted into a separate branch line side shell 9, 11 respectively.

The main line side shell 7 into which the one end side of each of the wires 3 is inserted is composed of an electrically conductive material and is assembled to a connector housing (not illustrated) which is fitted to an inverter side connector (not illustrated), for example. A main line side cylindrical part 17 into which the one end side of each of the wires 3 is inserted is provided at the main line side shell 7.

The branch line side shells 9, 11 into which the other end side of each of the wires 3 is inserted are composed of an electrically conductive material and are assembled to respective connector housings (not illustrated) which are fitted to respective connectors (not illustrated) on the two motor generator side, for example. Branch line side cylindrical parts 19, 21 into which the other end side of each of the wires 3 is inserted respectively are provided at the branch line side shells 9, 11.

One end of the shield member 5 is assembled to an outer circumference of the main line side cylindrical part 17 of the main line side shell 7, and the other end of the shield member 5 is assembled to the outer circumferences of the branch line side cylindrical parts 19, 21 of the branch line side shells 9, 11.

The shield member 5 is composed of a mesh shaped braided conductor in which an electrically conductive material is braided, or an electrically conductive metallic foil formed into a sheet shape, and is formed to have a cylindrical shape with the side of its branch line side shells 9, 11 (the other end side) branched into a fork. The shield member 5 may also be simply formed into a cylindrical shape without forming the side of the branch line side shells 9, 11 (the other end side) into a fork.

The shield member 5 covers the circumference of the wires 3 arranged between the main line side shell 7 and the branch line side shells 9, 11, and is assembled to the outer circumference of the main line side cylindrical part 17 of the main line side shell 7 at its one end, and is assembled to the outer circumferences of the branch line side cylindrical parts 19, 21 of the branch line side shells 9, 11 at its other end.

The shield member 5 is fixed at its assembly parts with the main line side cylindrical part 17 of the main line side shell 7 and with the branch line side cylindrical parts 19, 21 of the branch line side shells 9, 11 by fixing members such as crimping rings (not illustrated), and is electrically connected to the main line side shell 7 and the branch line side shells 9, 11 to form a shield circuit that prevents penetration or leakage of noise and the like on the wires 3.

The shield member 5 that covers the circumference of the wires 3 is provided with the isolation part 15 which mutually isolates the adjacent wires 3 at the branch part 13 in which the other end side of each of the wires 3 is inserted respectively into the branch line side shells 9, 11 and branched. The isolation part 15 is composed by joining opposing parts of an inner circumference surface of the shield member 5 by a jointing method such as welding.

Since the sets of the wires 3 that are separated by the isolation part 15 are connected to separate motor generators respectively, signals that have completely different properties are flowing. Therefore, by isolating with the isolation part 15, an electromagnetic interference of the adjacent wires 3 can be prevented and malfunction of the motor generators can be prevented.

Further, since the isolation part 15 is constructed by joining the shield member 5, it is not necessary that the branched wires 3 are covered independently with separate shield members 5, and the connection of the shield with the main line side shell 7 at one end of the shield member 5 can be done in one place, while a shielding effect similar to when separate shield members 5 are arranged can be obtained. In addition, since it is not necessary that a crimping member such as a clip is used, the number of component parts can be reduced.

In an assembly method of the wire branch structure 1, first, one end side of each of the wires 3 is inserted into the main line side shell 7. Next, one end of the shield member 5 is assembled to an outer circumference of the main line side cylindrical part 17 of the main line side shell 7. Subsequently, the other end side of each of the wires 3 is inserted into the branch line side cylindrical parts 19, 21 of the branch line side shells 9, 11 respectively, and the other end of the shield member 5 is assembled to the outer circumference of the branch line side cylindrical parts 19, 21 of the branch line side shells 9, 11 respectively. Further, the shield member 5 located at the branch part 13 of the wires 3 is joined by a jointing method such as welding, and the isolation part 15 is formed at the shield member 5 so as to mutually isolate the adjacent wires 3.

In the wire branch structure 1 according to the embodiment, the shield member 5 is provided with the isolation part 15 which mutually isolates the wires 3 which are adjacent to the branch part 13 in which the other end side (branch line side) of each of the wires 3 is inserted into the branch line side shells 9, 11 respectively and branched. Therefore, it is possible to prevent an electromagnetic interference of the adjacent wires 3 at the branch part 13 of the wires 3.

Further, the isolation part 15 is formed by joining opposing parts of an inner circumference surface of the shield member 5. Therefore, it is possible to provide the isolation part 15 without increasing the number of component parts.

Also, in the wire branch structure 1 according to the embodiment of the present invention, the wires 3 are branched with three wires as one set, and the isolation part 15 is provided between the branched adjacent wires 3, but it is not limited to this, and the isolation part 15 may be provided respectively between adjacent wires 3 that are connected to different branch line side shells. In addition, the isolation part 15 may also be provided between all the adjacent wires 3 respectively.

Further, the shield member 5 is formed by making the other end that are inserted in the two branch line side shells 9, 11 branched into a fork, but it is not limited to a shield member that is branched in advance, but it can be applied to a cylindrical shield member which is not branched in advance; for example, an isolation part may be formed in a cylindrical shield member by a jointing method such as welding, and thereafter, the other end may be branched into a fork such as by cutting along the isolation part or the like.

INDUSTRIAL APPLICABILITY

According to the present invention, it is possible to provide a wire branch structure which can prevent an electromagnetic interference of wires at a branch part of the wires.

The invention claimed is:

1. A wire branch structure, comprising:
   a plurality of wires;
   a shield member covering a circumference of the plurality of wires, the shield member made of a flexible conductive material having a cylindrical shape;
   a main line side shell provided at one end of the shield member, the main line side shell made of a conductive material having a circular shape, one end side of each of the plurality of wires inserted in the main line side shell;
   two or more branch line side shells provided at the other end of the shield member, each of the branch line side shells made of a conductive material having a circular shape, the other end side of each of the plurality of wires respectively inserted in a corresponding branch line side shell, the two or more branch line side shells branched from the main line side shell, the plurality of wires arranged between the main line side shell and the branch line side shells; and
   one or more isolation parts provided in the shield member, the one or more isolation parts isolating the plurality of wires, which are arranged between the main line side shell and the branch line side shells and are adjacent to a branch part in which the other end side of each of the plurality of wires is respectively inserted in the branch line side shells and branched, the one or more isolation parts each formed by joining opposing parts of an inner circumference surface of the shield member.

2. The wire branch structure according to claim 1, wherein the main line side shell into which the one end side of each of the plurality of wires is inserted is composed of an electrically conductive material to be assembled to a first connector housing.

3. The wire branch structure according to claim 2, wherein the branch line side shells into which the other end side of each of the plurality of wires is inserted are composed of an electrically conductive material to be assembled to respective second connector housings.

4. The wire branch structure according to claim 3, wherein
the main line side shell is to be assembled to the first connector housing on an inverter side, and
the branch line side shells are to be assembled to the respective second connector housing on a motor generator side.

5. The wire branch structure according to claim 1, wherein
one end of the shield member is to be assembled to an outer circumference of a main line side cylindrical part of the main line side shell, and
the other end of the shield member is to be assembled to outer circumferences of branch line side cylindrical parts of the branch line side shells.

6. The wire branch structure according to claim 5, wherein the shield member is fixed at its assembly parts with the main line side cylindrical part of the main line side shell and with the branch line side cylindrical parts of the branch line side shells by fixing members so as to be electrically connected to the main line side shell and the blanch line side shells to form a shield circuit to shield the plurality of wires form noise.

7. The wire branch structure according to claim 1, wherein
sets of the plurality of wires separated by the isolation parts are connected to separate motor generators respectively, and carry signals having the different properties, and
the isolation parts isolate the signals having the different properties such that an electromagnetic interference of the adjacent wires and a malfunction of the respective motor generators can be reduced or prevented.

8. The wire branch structure according to claim 1, wherein the shield member is composed of a mesh shaped braided conductor in which an electrically conductive material is braided.

9. The wire branch structure according to claim 1, wherein the shield member is composed of an electrically conductive metallic foil formed into a sheet shape.

10. The wire branch structure according to claim 1, wherein
the shield member is formed to have a cylindrical shape, and
the branch line side shells of the shield member comprise a branch into a fork.

11. The wire branch structure according to claim 1, wherein
the shield member is formed to have a cylindrical shape, and
the branch line side shells of shield member are not branched into a fork.

* * * * *